United States Patent
Chen et al.

(10) Patent No.: US 9,892,957 B2
(45) Date of Patent: Feb. 13, 2018

(54) SEMICONDUCTOR DEVICE STRUCTURE AND METHOD FOR FORMING THE SAME

(71) Applicant: TAIWAN SEMICONDUCTOR MANUFACTURING CO., LTD, Hsin-Chu (TW)

(72) Inventors: Wei-Ting Chen, Hsin-Chu (TW); Che-Cheng Chang, New Taipei (TW); Chen-Hsiang Lu, Hsin-Chu (TW); Yu-Cheng Liu, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 396 days.

(21) Appl. No.: 14/659,170

(22) Filed: Mar. 16, 2015

(65) Prior Publication Data

US 2016/0276272 A1    Sep. 22, 2016

(51) Int. Cl.
*H01L 21/768* (2006.01)
*H01L 21/311* (2006.01)
*H01L 23/532* (2006.01)

(52) U.S. Cl.
CPC .. *H01L 21/76804* (2013.01); *H01L 21/31116* (2013.01); *H01L 21/31138* (2013.01); *H01L 21/31144* (2013.01); *H01L 21/76811* (2013.01); *H01L 21/76816* (2013.01); *H01L 23/53295* (2013.01); *H01L 21/76832* (2013.01)

(58) Field of Classification Search
CPC ............ H01L 23/5223; H01L 23/5226; H01L 21/76816
See application file for complete search history.

(56) References Cited

U.S. PATENT DOCUMENTS

| 5,620,925 A | * | 4/1997 | Nakata | H01L 21/28525 |
| | | | | 257/E21.586 |
| 6,177,347 B1 | | 1/2001 | Liu et al. | |
| 6,713,873 B1 | * | 3/2004 | O'Loughlin | H01L 21/3141 |
| | | | | 257/753 |
| 7,259,463 B2 | | 8/2007 | Huang et al. | |
| 8,314,026 B2 | * | 11/2012 | Uehling | H01L 23/5226 |
| | | | | 438/637 |
| 8,629,058 B2 | | 1/2014 | Shue et al. | |
| 8,673,765 B2 | | 3/2014 | Wang et al. | |

(Continued)

*Primary Examiner* — Matthew Landau
*Assistant Examiner* — Krista Soderholm
(74) *Attorney, Agent, or Firm* — Birch, Stewart, Kolasch & Birch, LLP

(57) ABSTRACT

A semiconductor device structure is provided. The semiconductor device structure includes a substrate and a first dielectric layer over the substrate. The semiconductor device structure includes a second dielectric layer over the first dielectric layer. The first dielectric layer and the second dielectric layer are made of different materials. The semiconductor device structure includes a conductive via structure passing through the first dielectric layer and penetrating into the second dielectric layer. The conductive via structure has a first portion and a second portion. The first portion and the second portion are in the first dielectric layer and the second dielectric layer respectively. The first portion has a first end portion facing the substrate. A first width of the first end portion is greater than a second width of the second portion.

17 Claims, 13 Drawing Sheets

(56) References Cited

U.S. PATENT DOCUMENTS

| | | | |
|---|---|---|---|
| 8,946,004 B2 * | 2/2015 | Kim | G02F 1/136227 |
| | | | 257/E29.291 |
| 9,214,424 B2 * | 12/2015 | Stecher | H01L 23/5225 |
| 9,385,079 B2 * | 7/2016 | Chang | H01L 23/5256 |
| 2004/0175929 A1 * | 9/2004 | Schmitt | C23C 16/0272 |
| | | | 438/628 |
| 2008/0026564 A1 | 1/2008 | Frohberg et al. | |

* cited by examiner

SEMICONDUCTOR DEVICE STRUCTURE AND METHOD FOR FORMING THE SAME

CROSS REFERENCE TO RELATED APPLICATIONS

This application is related to the co-pending and commonly assigned application Ser. No. 14/658,525, filed on Mar. 16, 2015 and entitled "SEMICONDUCTOR DEVICE STRUCTURE AND METHOD FOR FORMING THE SAME", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
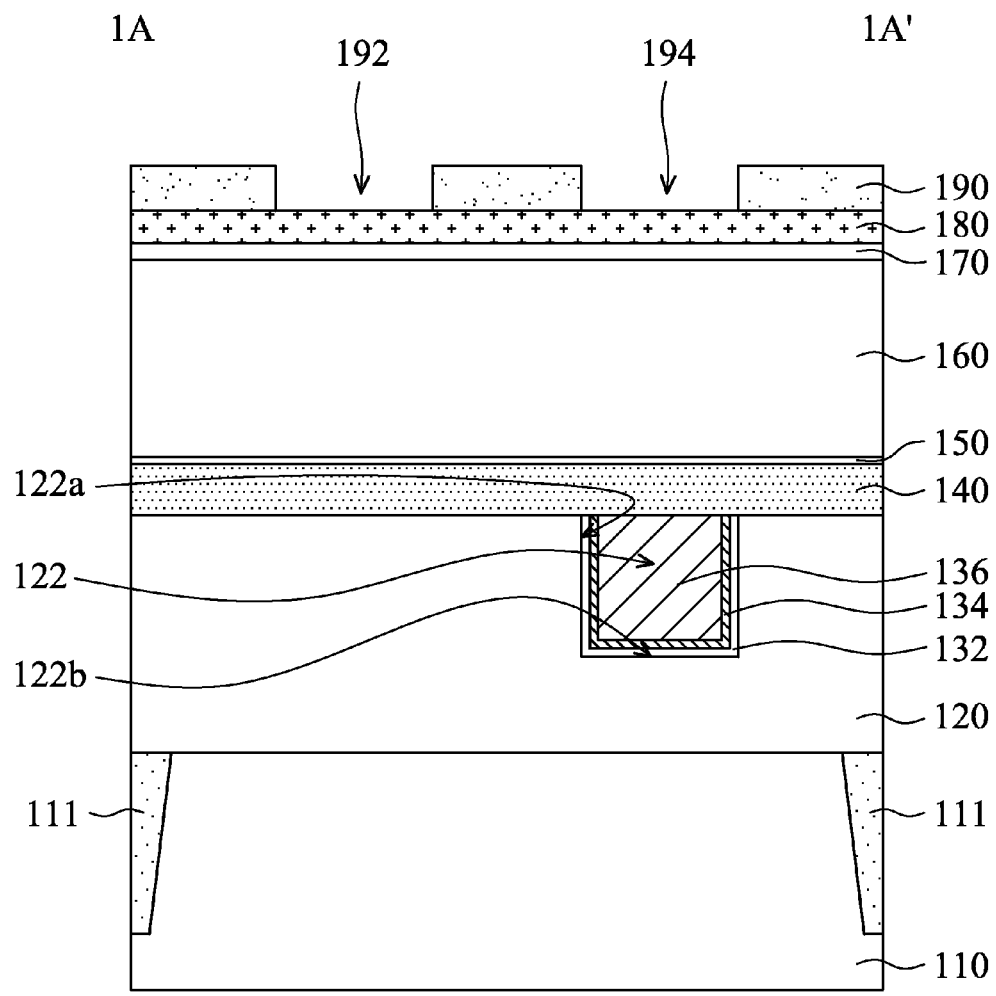
FIGS. 1A-1H are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1B:
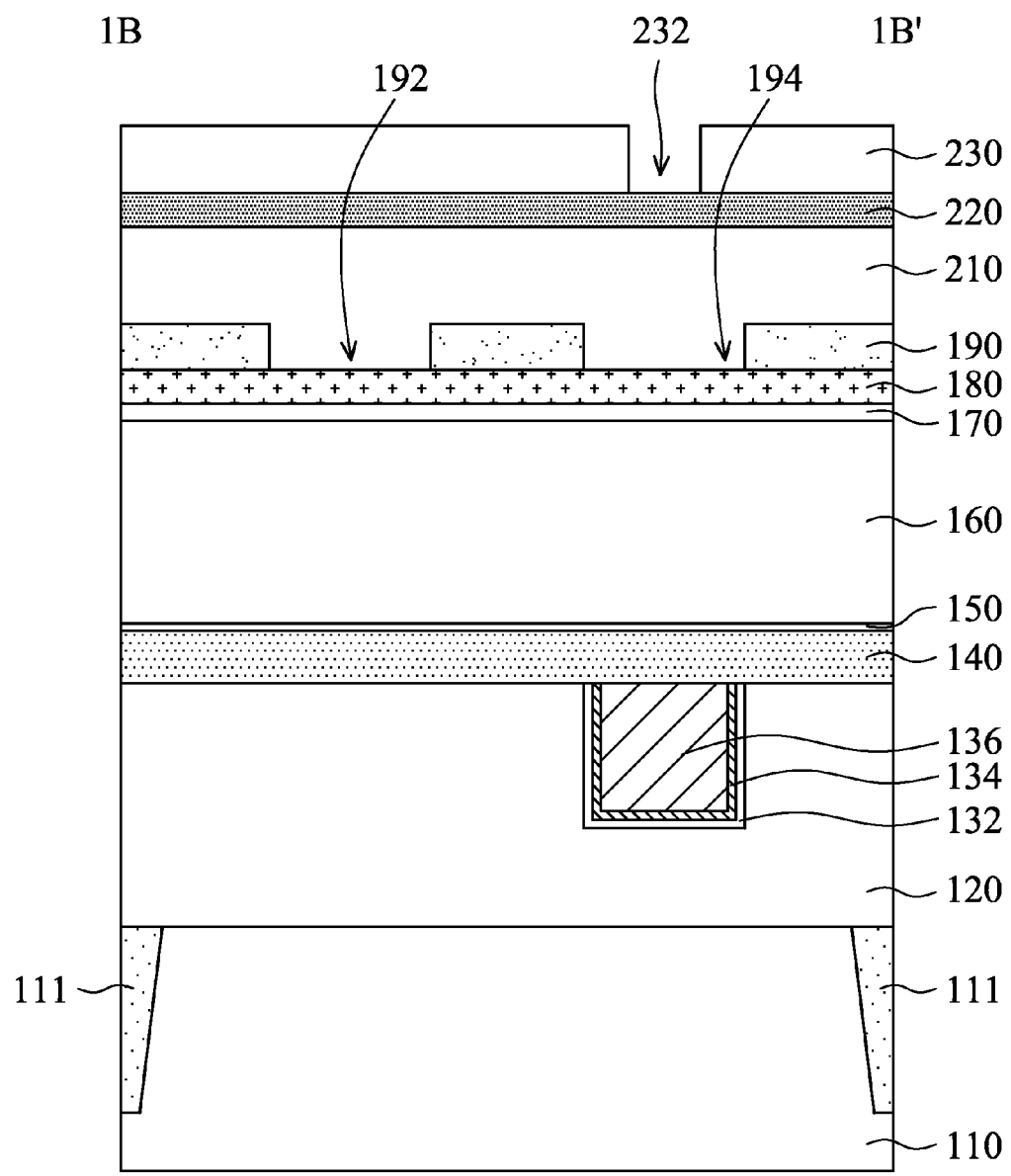
Figure 1C:
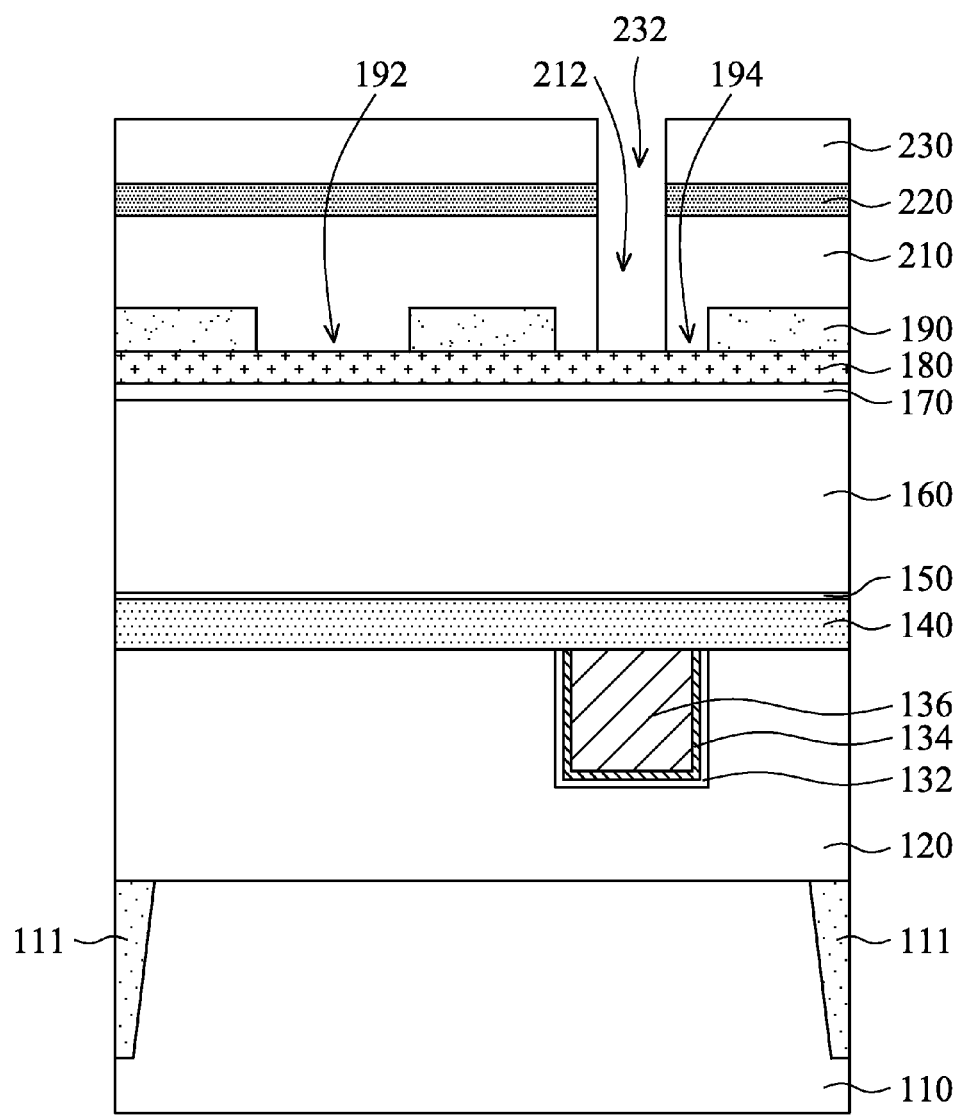
Figure 1D:
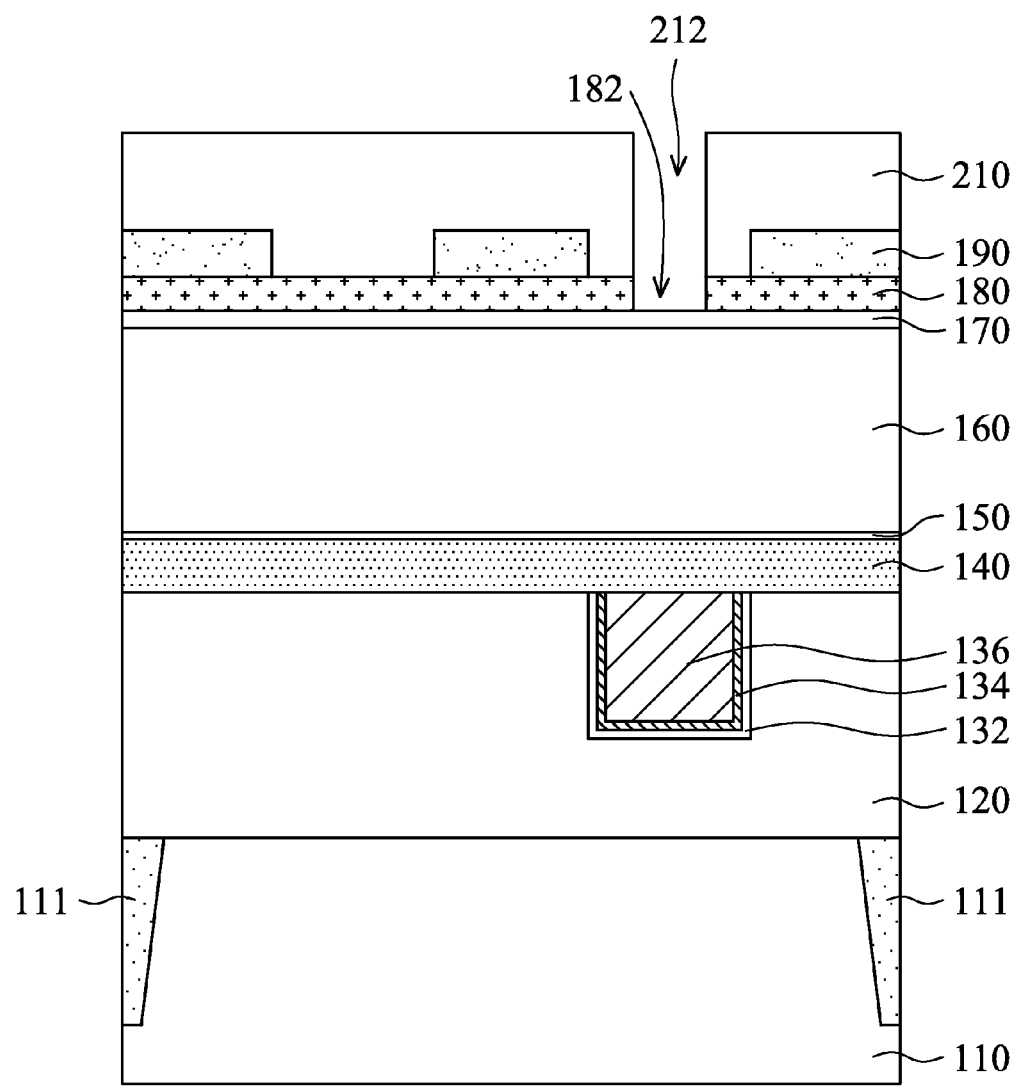
Figure 1E:
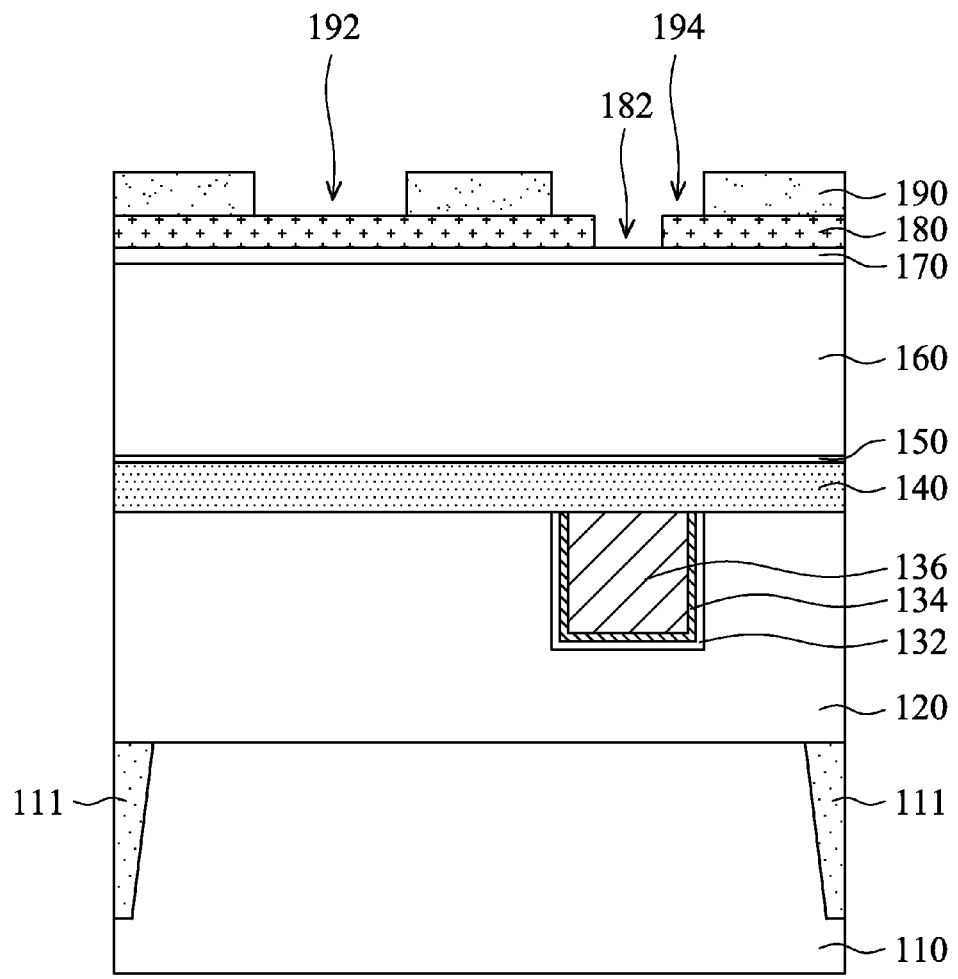
Figure 1F:
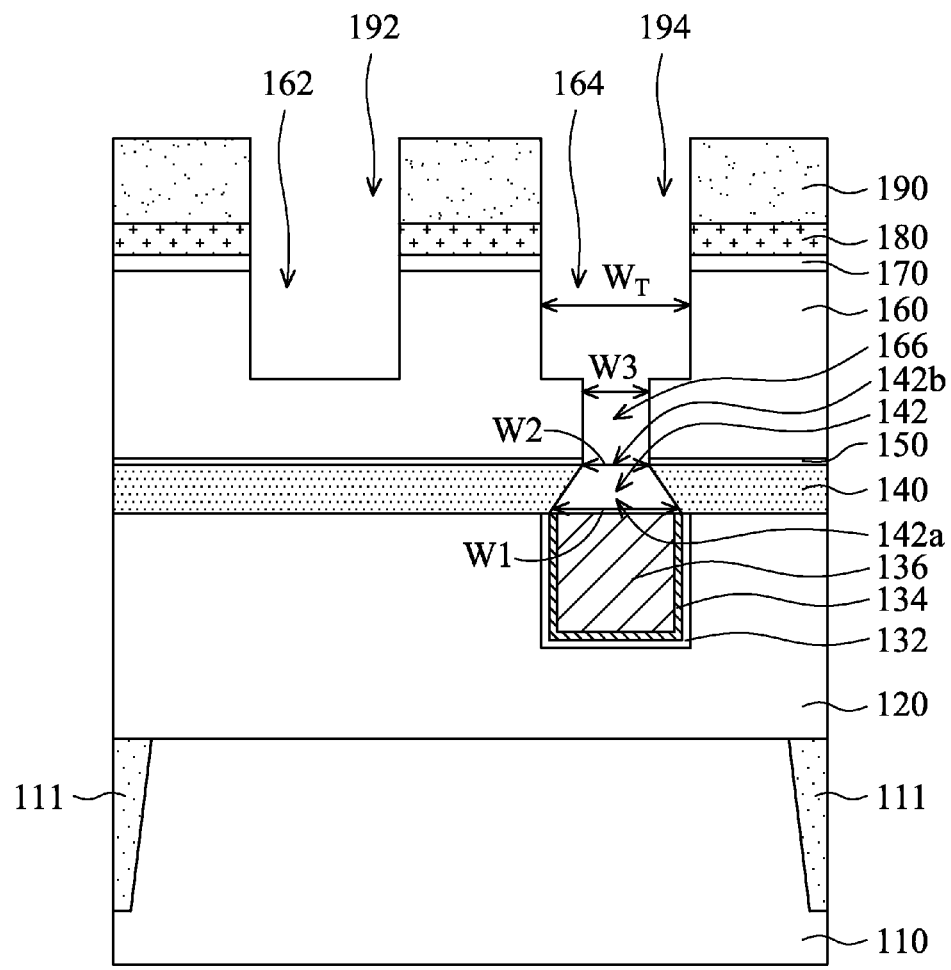
Figure 1G:
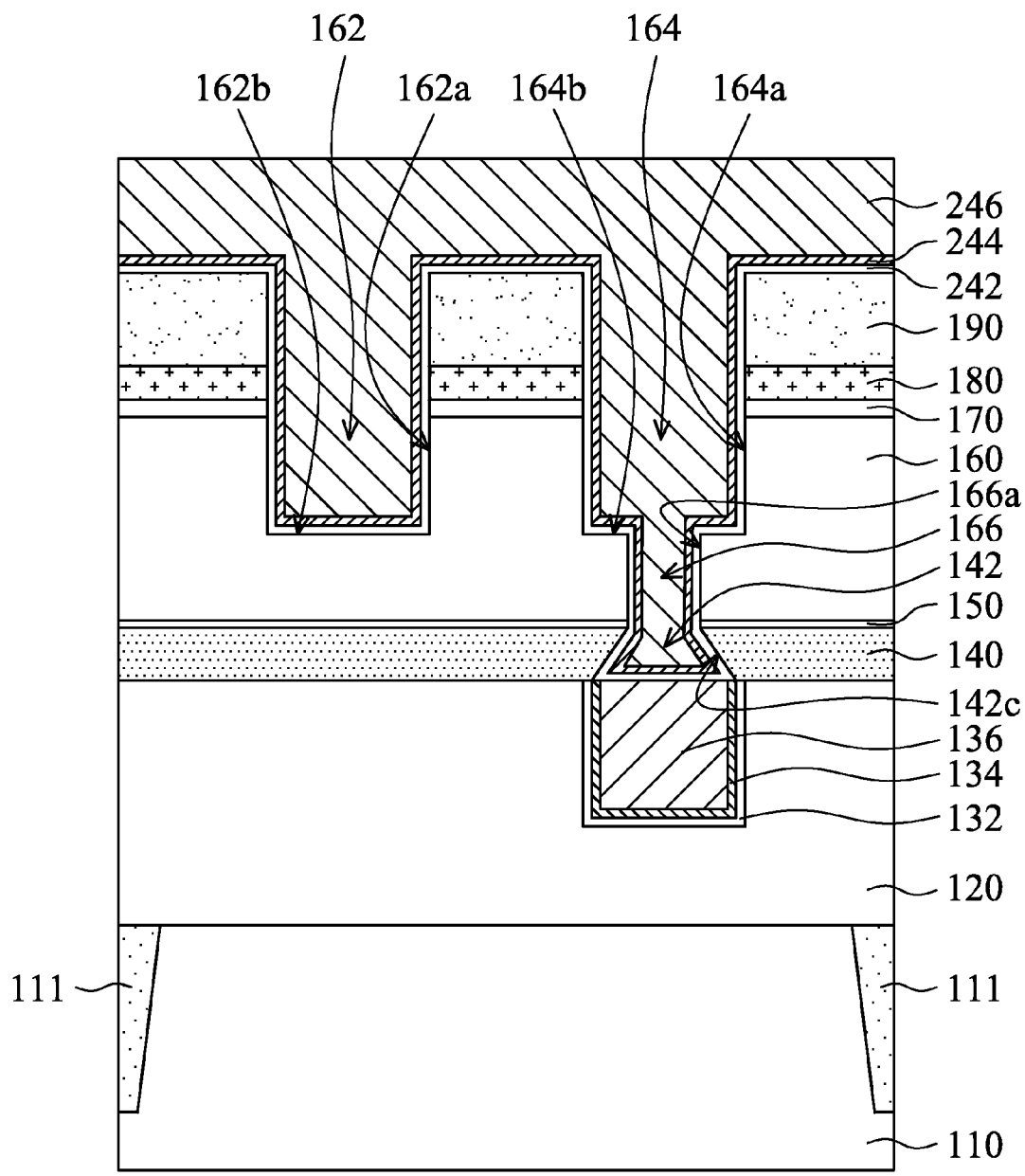
Figure 1H:
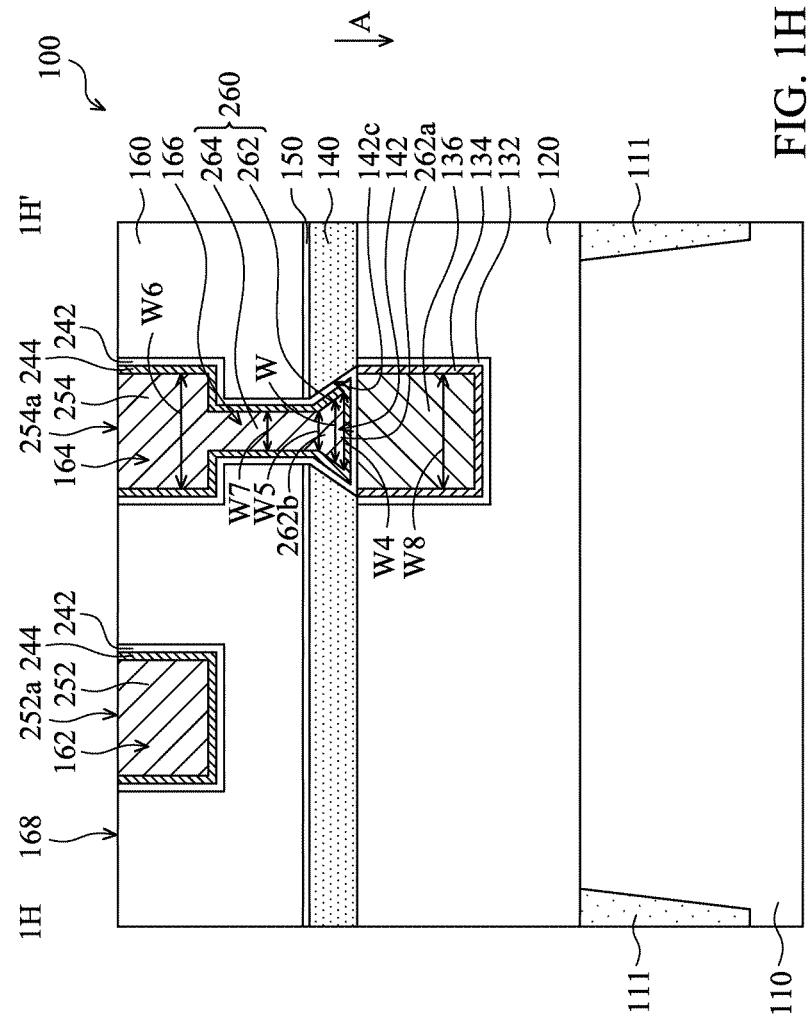
Figure 2A:
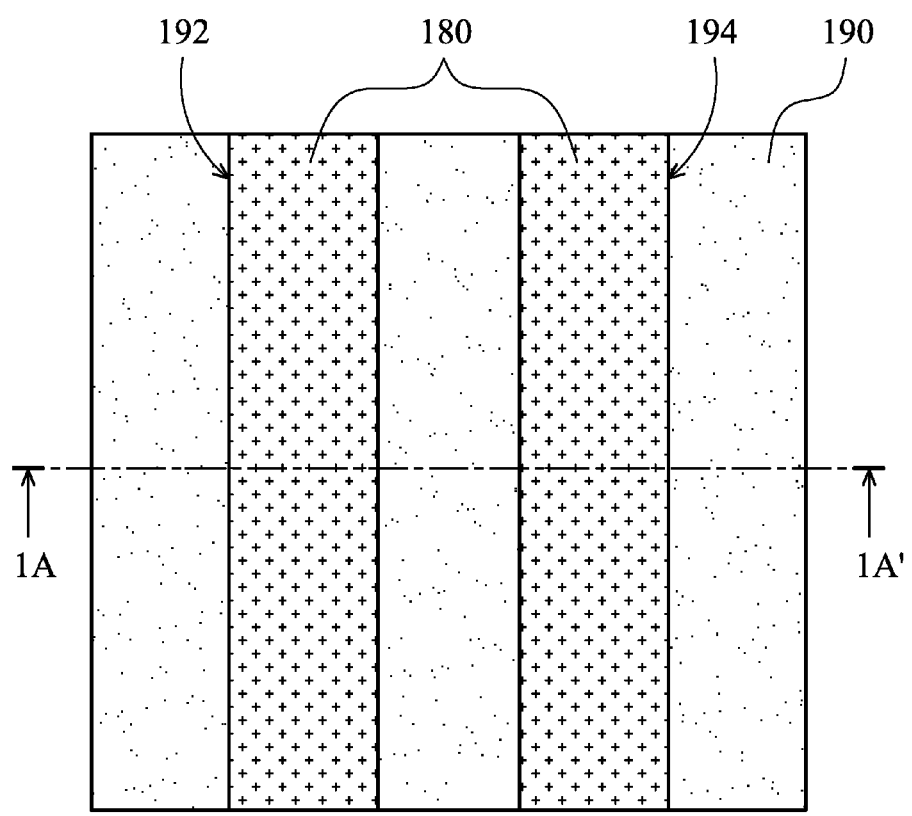
FIGS. 2A-2C are top views of the structures in FIGS. 1A-1B and 1H, respectively, in accordance with some embodiments.
Figure 2B:
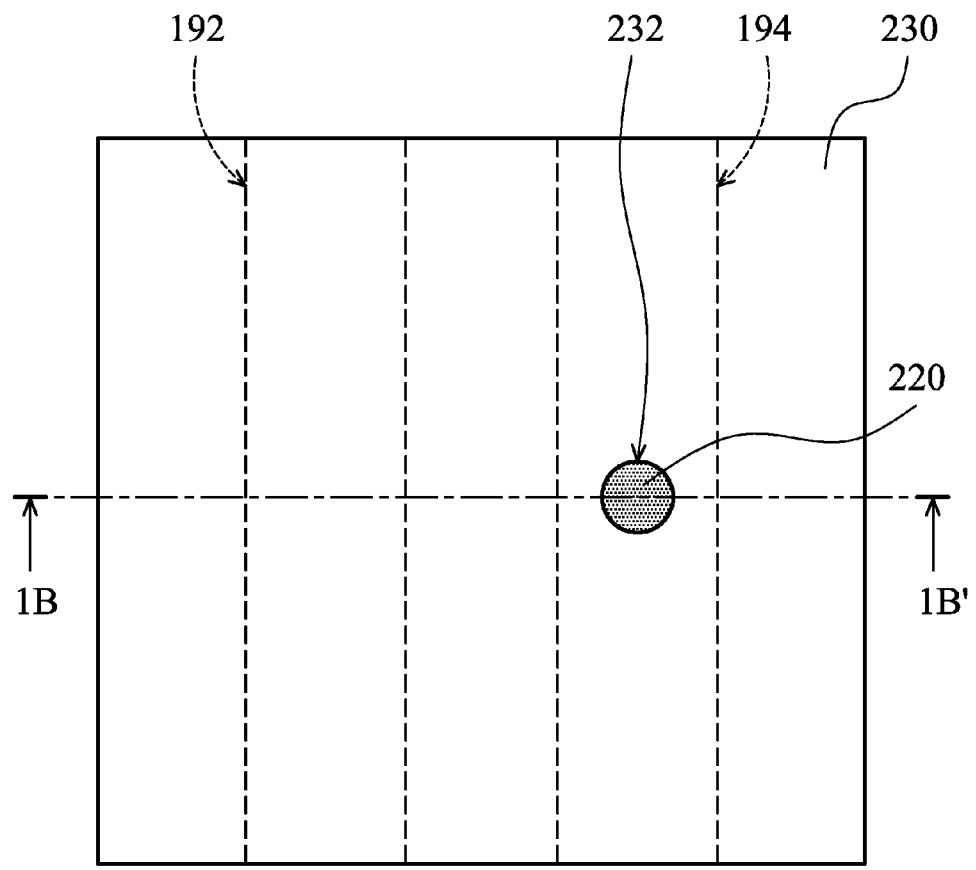
Figure 2C:
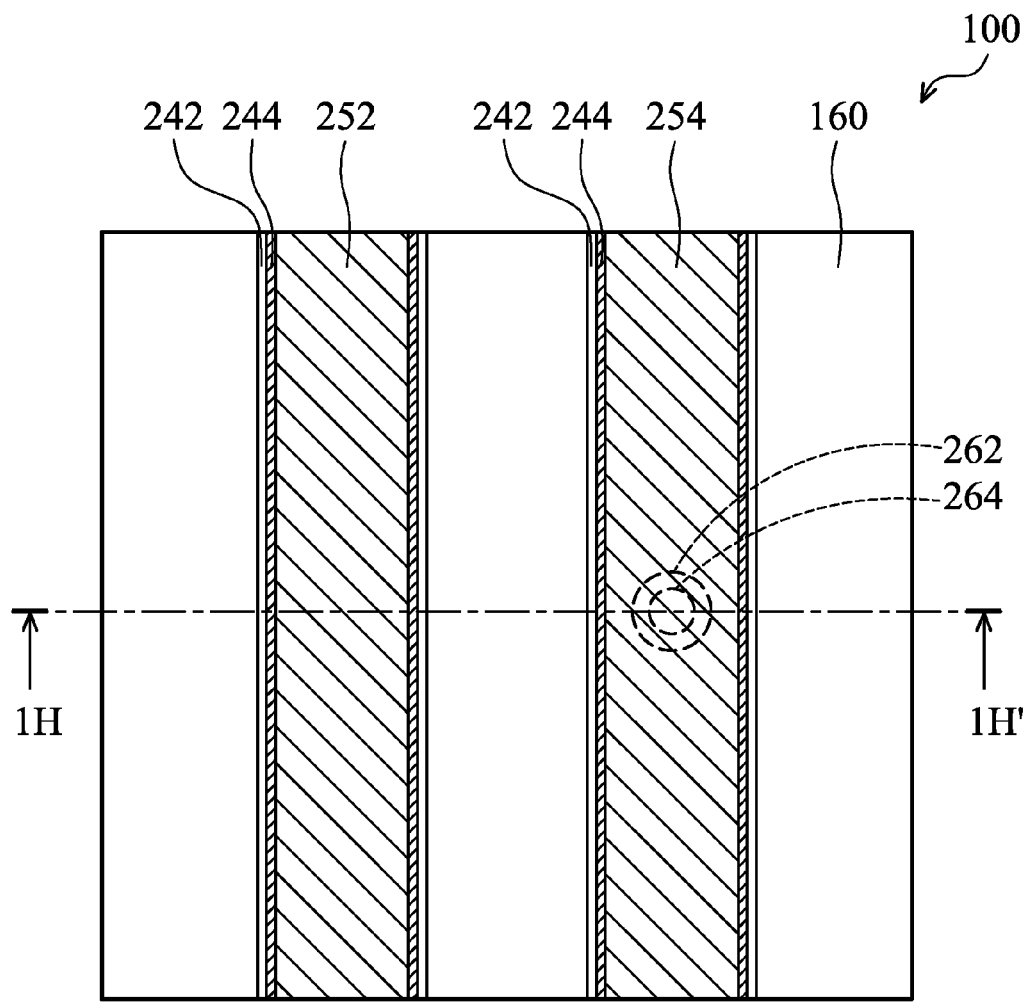

FIGS. 1A-1H are cross-sectional views of various stages of a process for forming a semiconductor device structure 100, in accordance with some embodiments. FIGS. 2A-2C are top views of the structures in FIGS. 1A-1B and 1H, respectively, in accordance with some embodiments. FIGS. 1A-1B and 1H are cross-sectional views illustrating the structures along sectional lines 1A-1A', 1B-1B', and 1H-1H' in FIGS. 2A-2C, respectively, in accordance with some embodiments.

As shown in FIG. 1A, a substrate 110 is provided, in accordance with some embodiments. The substrate 110 may be a semiconductor wafer such as a silicon wafer. Alternatively or additionally, the substrate 110 may include elementary semiconductor materials, compound semiconductor materials, and/or alloy semiconductor materials.

Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

As shown in FIG. 1A, an isolation structure 111 is formed in the semiconductor substrate 110, in accordance with some embodiments. The isolation structure 111 surrounds a device region of the semiconductor substrate 110, in accordance with some embodiments. The isolation structure 111 is configured to define and electrically isolate various device elements (not shown) formed in the semiconductor substrate 110, in accordance with some embodiments.

Examples of device elements may include, but are not limited to, transistors, diodes, and/or other applicable elements. Examples of the transistors may include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like. Various processes are performed to form the device elements, such as deposition, etching, implantation, photolithography, annealing, and/or other applicable processes.

As shown in FIG. 1A, a dielectric layer 120 is formed over the substrate 110 and the isolation structure 111, in accordance with some embodiments. The dielectric layer 120 includes dielectric materials, in accordance with some embodiments. Examples of the dielectric materials may include, but are not limited to, oxide, $SiO_2$, borophosphosilicate glass (BPSG), spin on glass (SOG), undoped silicate glass (USG), fluorinated silicate glass (FSG), high-density plasma (HDP) oxide, or plasma-enhanced TEOS (PETEOS).

The dielectric layer 120 may include multilayers made of multiple dielectric materials, such as a low dielectric constant or an extreme low dielectric constant (ELK) material. The dielectric layer 120 may be formed by chemical vapor deposition (CVD), physical vapor deposition (PVD), atomic layer deposition (ALD), spin-on coating, or another applicable process.

As shown in FIG. 1A, a trench 122 is formed in the dielectric layer 120, in accordance with some embodiments. The trench 122 is formed using a photolithography process and an etching process, in accordance with some embodiments. As shown in FIG. 1A, a barrier layer 132 is formed in the trench 122, in accordance with some embodiments. The barrier layer 132 conformally covers inner walls 122a and a bottom surface 122b of the trench 122, in accordance with some embodiments. The barrier layer 132 is configured to prevent diffusion of metal materials formed in the trench 122 into the dielectric layer 120, in accordance with some embodiments. The barrier layer 132 includes tantalum or another suitable material. The barrier layer 132 is formed using a physical vapor deposition process, in accordance with some embodiments.

As shown in FIG. 1A, a seed layer 134 is formed over the barrier layer 132, in accordance with some embodiments. The seed layer 134 includes copper (Cu) and manganese (Mn) or other suitable materials. The seed layer 134 is formed using a physical vapor deposition process, in accordance with some embodiments. As shown in FIG. 1A, a conductive line 136 is formed in the trench 122 and over the seed layer 134, in accordance with some embodiments. The conductive line 136 includes aluminum (Al), copper (Cu), or another suitable material. The conductive line 136 is formed using a plating process, in accordance with some embodiments.

As shown in FIG. 1A, a dielectric layer 140 is formed over the dielectric layer 120, the barrier layer 132, the seed layer 134, and the conductive line 136, in accordance with some embodiments. The dielectric layer 140 is configured to prevent diffusion of metal materials of the conductive line 136 into a dielectric layer formed thereover, in accordance with some embodiments.

The dielectric layer 140 includes dielectric materials, in accordance with some embodiments. The dielectric layer 140 includes silicon carbide, silicon nitride, or another suitable dielectric material. The dielectric layers 120 and 140 are made of different materials, in accordance with some embodiments. The dielectric layer 140 may include multilayers made of different dielectric materials. The dielectric layer 140 may be formed by chemical vapor deposition (CVD), physical vapor deposition (PVD), atomic layer deposition (ALD), spin-on coating, or another applicable process.

As shown in FIG. 1A, an adhesive layer 150 is formed over the dielectric layer 140, in accordance with some embodiments. The adhesive layer 150 is configured to adhere the dielectric layer 140 to another dielectric layer thereon. The adhesive layer 150 includes tetraethoxysilane (TEOS) or another suitable material. In some other embodiments, the adhesive layer 150 is not formed.

As shown in FIG. 1A, a dielectric layer 160 is formed over the adhesive layer 150, in accordance with some embodiments. The dielectric layers 160 and 140 are made of different materials, such that the dielectric layers 160 and 140 can have etching selectivity in subsequent etching processes, in accordance with some embodiments. The dielectric layers 160 and 140 and the adhesive layer 150 are made of different materials, in accordance with some embodiments.

The dielectric layer 160 includes dielectric materials, in accordance with some embodiments. Examples of the dielectric materials may include, but are not limited to, oxide, $SiO_2$, borophosphosilicate glass (BPSG), spin on glass (SOG), undoped silicate glass (USG), fluorinated silicate glass (FSG), high-density plasma (HDP) oxide, or plasma-enhanced TEOS (PETEOS).

The dielectric layer 160 may include multilayers made of multiple dielectric materials, such as a low dielectric constant or an extreme low dielectric constant (ELK) material. The dielectric layer 160 may be formed by chemical vapor deposition (CVD), physical vapor deposition (PVD), atomic layer deposition (ALD), spin-on coating, or another applicable process.

As shown in FIG. 1A, an etching stop layer 170 is formed over the dielectric layer 160, in accordance with some embodiments. The etching stop layer 170 includes silicon nitride, silicon oxide, or another suitable material. The etching stop layer 170 is formed using a chemical vapor deposition process, in accordance with some embodiments.

As shown in FIG. 1A, an etching stop layer 170 is formed over the dielectric layer 160, in accordance with some embodiments. The etching stop layer 170 includes silicon nitride, silicon oxide, or another suitable material. The etching stop layer 170 is formed using a chemical vapor deposition process, in accordance with some embodiments.

As shown in FIG. 1A, a mask layer 180 is formed over the etching stop layer 170, in accordance with some embodiments. In some embodiments, the mask layer 180 includes oxide, such as silicon oxide. In some embodiments, the mask layer 180 includes silicon nitride, titanium nitride, other applicable materials, or a combination thereof. In some embodiments, the mask layer 180 is formed using a chemical vapor deposition process.

As shown in FIGS. 1A and 2A, a hard mask layer 190 is formed over the mask layer 180, in accordance with some embodiments. The hard mask layer 190 has trenches 192 and 194, in accordance with some embodiments. The trenches 192 and 194 expose a portion of the mask layer 180, in accordance with some embodiments.

Examples of a material for the hard mask layer 190 include, but are not limited to, silicon oxide, silicon nitride (e.g., $Si_3N_4$), SiON, SiC, SiOC, or a combination thereof. The hard mask layer 190 may be formed by chemical vapor deposition (CVD), physical vapor deposition (PVD), atomic layer deposition (ALD), spin-on coating, or another applicable process. In some embodiments, the mask layer 180 and the hard mask layer 190 are made of different materials, such that the mask layer 180 and the hard mask layer 190 can have etching selectivity in subsequent etching processes.

As shown in FIGS. 1B and 2B, a cover layer 210 is formed over the hard mask layer 190 and filled into the trenches 192 and 194, in accordance with some embodiments. The cover layer 210 is made of a polymer material or another suitable material. The cover layer 210 is formed by a coating process, a CVD process, or another suitable process.

As shown in FIGS. 1B and 2B, a middle layer 220 is formed over the cover layer 210, in accordance with some embodiments. In some embodiments, the middle layer 220 is made of a silicon-containing material (e.g., a silicon-containing polymer material). In some embodiments, the mask layer 180, the hard mask layer 190, the cover layer 210, and the middle layer 220 are made of different materials, such that they can have etching selectivity in etching processes performed afterwards. The middle layer 220 is formed by a coating process, a CVD process, or another suitable process.

As shown in FIGS. 1B and 2B, a photoresist layer 230 is formed over the middle layer 220, in accordance with some embodiments. The photoresist layer 230 has an opening 232 exposing a portion of the middle layer 220, in accordance with some embodiments. The photoresist layer 230 is made of a photoresist material, in accordance with some embodiments. The photoresist layer 230 is formed by, for example, a coating process and a photolithography process.

As shown in FIG. 1C, the portion of the middle layer 220 and the cover layer 210 under the opening 232 are removed through the opening 232, in accordance with some embodiments. After the removal process, an opening 212 passing through the middle layer 220 and the cover layer 210 is formed, in accordance with some embodiments. The opening 212 is connected to the opening 232 and exposes a portion of the mask layer 180, in accordance with some embodiments. The opening 212 is positioned in the trench 194, in accordance with some embodiments. The removal process includes a dry etching process, in accordance with some embodiments.

As shown in FIG. 1D, the middle layer 220 and the photoresist layer 230 are removed, in accordance with some embodiments. The removal process includes a dry etching process or a wet etching process, in accordance with some embodiments. Thereafter, the portion of the mask layer 180 is removed through the opening 212, in accordance with some embodiments. After the removal process, an opening 182 is formed in the mask layer 180 and exposes a portion of the etching stop layer 170, in accordance with some embodiments.

The removal process includes a dry etching process, in accordance with some embodiments. The dry etching process includes a plasma etching process, in accordance with some embodiments. The plasma etching process is performed under a pressure ranging from about 1 mTorr to about 100 mTorr and using power ranging from about 100 W to about 1500 W, in accordance with some embodiments. The plasma etching process is performed at a temperature ranging from about 10° C. to about 70° C., in accordance with some embodiments. The plasma etching process uses a gas including $CF_4$, $H_2$, $N_2$, $C_4F_8$, $O_2$, and/or $CH_2F_2$, in accordance with some embodiments.

As shown in FIG. 1E, the cover layer 210 is removed, in accordance with some embodiments. The removal process includes a dry etching process, in accordance with some embodiments. The dry etching process includes a plasma etching process, in accordance with some embodiments. The plasma etching process is performed under a pressure ranging from about 1 mTorr to about 100 mTorr and using power ranging from about 100 W to about 1500 W, in accordance with some embodiments. The plasma etching process is performed at a temperature ranging from about 10° C. to about 70° C., in accordance with some embodiments. The plasma etching process uses a gas including $CO_2$, $C_4H_8$, $CF_4$, $O_2$, $N_2$, and/or Ar, in accordance with some embodiments.

As shown in FIG. 1F, an etching process is performed to remove portions of the mask layer 180, the etching stop layer 170, the dielectric layer 160 under the trench 192 and portions of the mask layer 180, the etching stop layer 170, the dielectric layer 160, the adhesive layer 150, and the dielectric layer 140 under the trench 194, in accordance with some embodiments.

After the etching process, trenches 162 and 164 and a hole 166 are formed in the dielectric layer 160, and a through hole 142 is formed in the dielectric layer 140, in accordance with some embodiments. The hole 166 is under the trench 164 and connected to the trench 164 and the through hole 142, in accordance with some embodiments. In some embodiments, the hole 166 further passes through the adhesive layer 150. The through hole 142 exposes a portion of the conductive line 136, in accordance with some embodiments. The through hole 142 further exposes a portion of the seed layer 134, in accordance with some embodiments.

Since the dielectric layers 160 and 140 are made of different materials, the dielectric layers 160 and 140 can have etching selectivity in the etching processes, in accordance with some embodiments. The through hole 142 has a first end opening 142a and a second end opening 142b, in accordance with some embodiments. The first end opening 142a faces the substrate 110, in accordance with some embodiments. The second end opening 142b faces the hole 166, in accordance with some embodiments.

A width W1 of the first end opening 142a is greater than a width W2 of the second end opening 142b, in accordance with some embodiments. The width W1 of the first end opening 142a is greater than a width W3 of the hole 166, in accordance with some embodiments. The width W1 of the first end opening 142a is less than a width $W_T$ of the trench 164, in accordance with some embodiments.

The etching process includes a dry etching process, in accordance with some embodiments. The dry etching process includes a plasma etching process, in accordance with some embodiments. The plasma etching process is performed under a pressure ranging from about 1 mTorr to about 100 mTorr and using power ranging from about 100 W to about 1500 W, in accordance with some embodiments. The plasma etching process is performed at a temperature ranging from about 10° C. to about 70° C., in accordance with some embodiments. The plasma etching process uses a gas including $C_4F_8$, $CF_4$, $O_2$, $N_2$, and/or Ar, in accordance with some embodiments.

As shown in FIG. 1G a barrier layer 242 is formed in the trenches 162 and 164, the hole 166, and the through hole 142, in accordance with some embodiments. The barrier layer 242 conformally covers inner walls 162a, 164a, 166a, and 142c of the trenches 162 and 164, the hole 166, and the through hole 142 and bottom surfaces 162b and 164b of the trenches 162 and 164, in accordance with some embodiments.

The barrier layer 242 is configured to prevent diffusion of metal materials formed in the trenches 162 and 164, the hole 166, and the through hole 142 into the dielectric layers 140 and 160 and the adhesive layer 150, in accordance with some embodiments. The barrier layer 242 includes tantalum or another suitable material. The barrier layer 242 is formed using a physical vapor deposition process, in accordance with some embodiments.

As shown in FIG. 1G, a seed layer 244 is formed over the barrier layer 242, in accordance with some embodiments. The seed layer 244 includes copper (Cu) and manganese (Mn) or other suitable materials. The seed layer 244 is formed using a physical vapor deposition process, in accordance with some embodiments.

As shown in FIG. 1G, a conductive layer 246 is formed in the trenches 162 and 164 the hole 166, and the through hole 142 and over the seed layer 244, in accordance with some embodiments. The conductive layer 246 includes aluminum (Al), copper (Cu), or another suitable material. The conductive layer 246 is formed using a plating process, in accordance with some embodiments.

As shown in FIGS. 1H and 2C, the barrier layer 242, the seed layer 244, and the conductive layer 246 outside of the trenches 162 and 164, the hole 166, and the through hole 142, the mask layer 180, and the hard mask layer 190 are removed, in accordance with some embodiments. The removal process includes a planarization process, such as a chemical mechanical polishing process, in accordance with some embodiments.

The conductive layer 246 remaining in the trench 162 forms a conductive line 252, in accordance with some embodiments. The conductive layer 246 remaining in the trench 164 forms a conductive line 254 in accordance with some embodiments. In some embodiments, the top surface 252a of the conductive line 252, the top surface 254a of the conductive line 254, and the top surface 168 of the dielectric layer 160 are coplanar with each other. The conductive layer 246 remaining in the hole 166 and the through hole 142 forms a conductive via structure 260, in accordance with some embodiments. The conductive via structure 260 is an integral structure, in accordance with some embodiments. The conductive line 254 and the conductive via structure 260 are formed into an integral structure, in accordance with some embodiments.

The conductive via structure 260 passes through the dielectric layer 140 and penetrates into the dielectric layer 160, in accordance with some embodiments. The conductive via structure 260 further passes through the adhesive layer 150 between the dielectric layers 140 and 160, in accordance with some embodiments. The conductive via structure 260 has a first portion 262 and a second portion 264, and the first portion 262 and the second portion 264 are in the dielectric layer 140 and the dielectric layer 160 respectively, in accordance with some embodiments. In some embodiments, the width W of the first portion 262 continuously increases in direction A from the dielectric layer 160 to the substrate 110.

The first portion 262 has a first end portion 262a and a second end portion 262b, in accordance with some embodiments. The second end portion 262b is between the first end portion 262a and the second portion 264, in accordance with some embodiments. The second end portion 262b is adjacent to the second portion 264, in accordance with some embodiments. In some embodiments, a width W4 of the first end portion 262a is greater than a width W5 of the second end portion 262b.

The conductive line 254 is in the dielectric layer 160 and over the conductive via structure 260, in accordance with some embodiments. The second portion 264 of the conductive via structure 260 is in direct contact with the conductive line 254, in accordance with some embodiments. The width W4 of the first end portion 262a is less than the width W6 of the conductive line 254, in accordance with some embodiments. Since the first end portion 262a is narrower than the conductive line 254, the probability of short-circuiting the first end portion 262a with other conductive structures in the dielectric layers 140 and 120 is reduced.

The conductive line 136 is under the conductive via structure 260 and electrically connected to the conductive via structure 260, in accordance with some embodiments. The width W4 of the first end portion 262a is less than the width W8 of the conductive line 136, in accordance with some embodiments. Since the first end portion 262a is narrower than the conductive line 136, the probability of short-circuiting the first end portion 262a with other conductive structures in the dielectric layers 140 and 120 is reduced.

The width W4 of the first end portion 262a is greater than the width W7 of the second portion 264, in accordance with some embodiments. That is, the conductive via structure 260 has an enlarged end portion (i.e. the first end portion 262a). Therefore, the probability of connecting the conductive via structure 260 with the enlarged end portion 262a to the conductive line 136 is increased. As a result, the yield is improved. Furthermore, the enlarged end portion 262a is able to enlarge the connection area between the conductive via structure 260 and the conductive line 136, which reduces the contact resistance between the conductive via structure 260 and the conductive line 136.

In some embodiments, the difference between the width W4 and the width W7 ranges from about 2 nm to about 10 nm. In some embodiments, a ratio of the width W4 to the width W7 ranges from about 1.2 to about 1.4.

Figure 3:
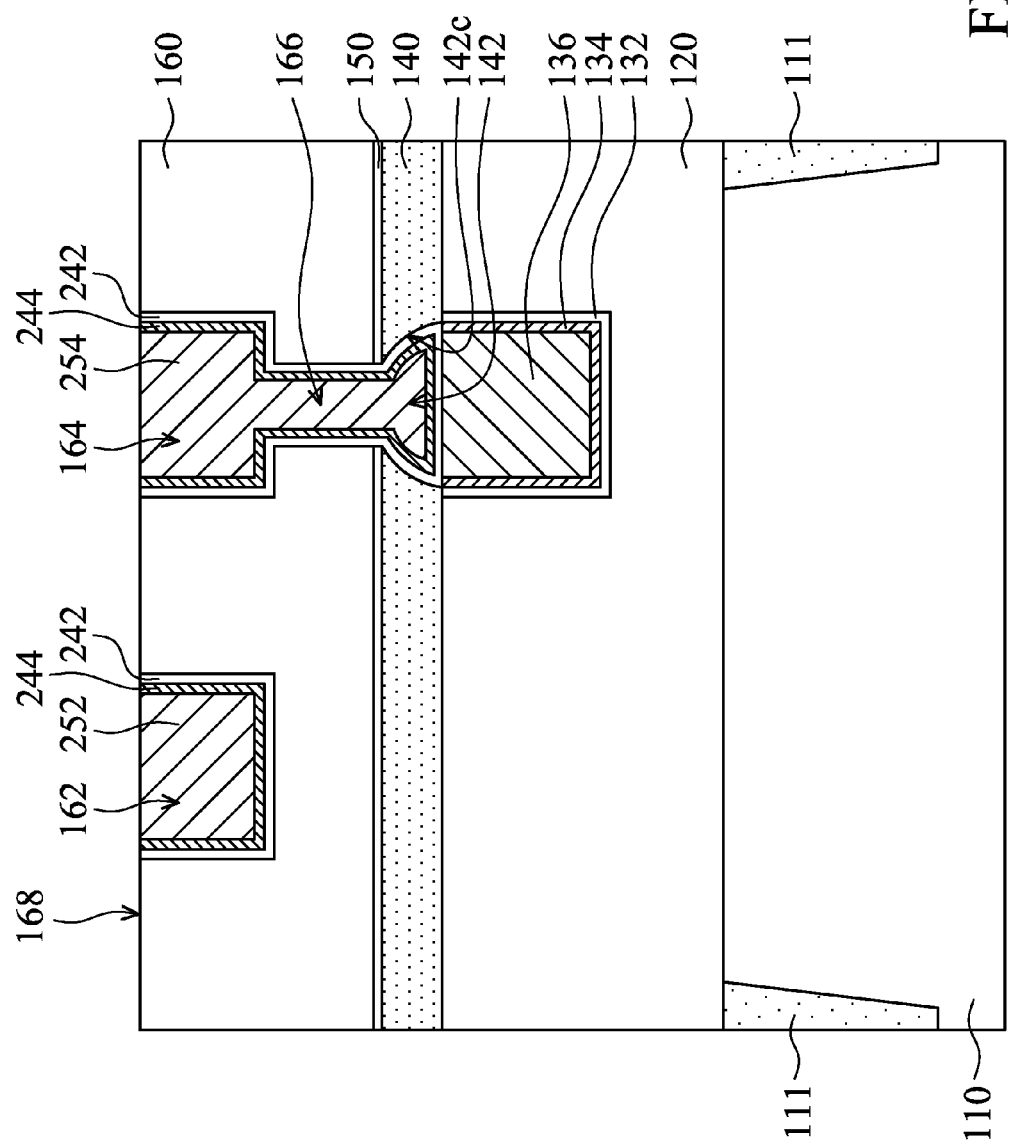
FIG. 3 is a cross-sectional view of a semiconductor device structure, in accordance with some embodiments.
Figure 4:
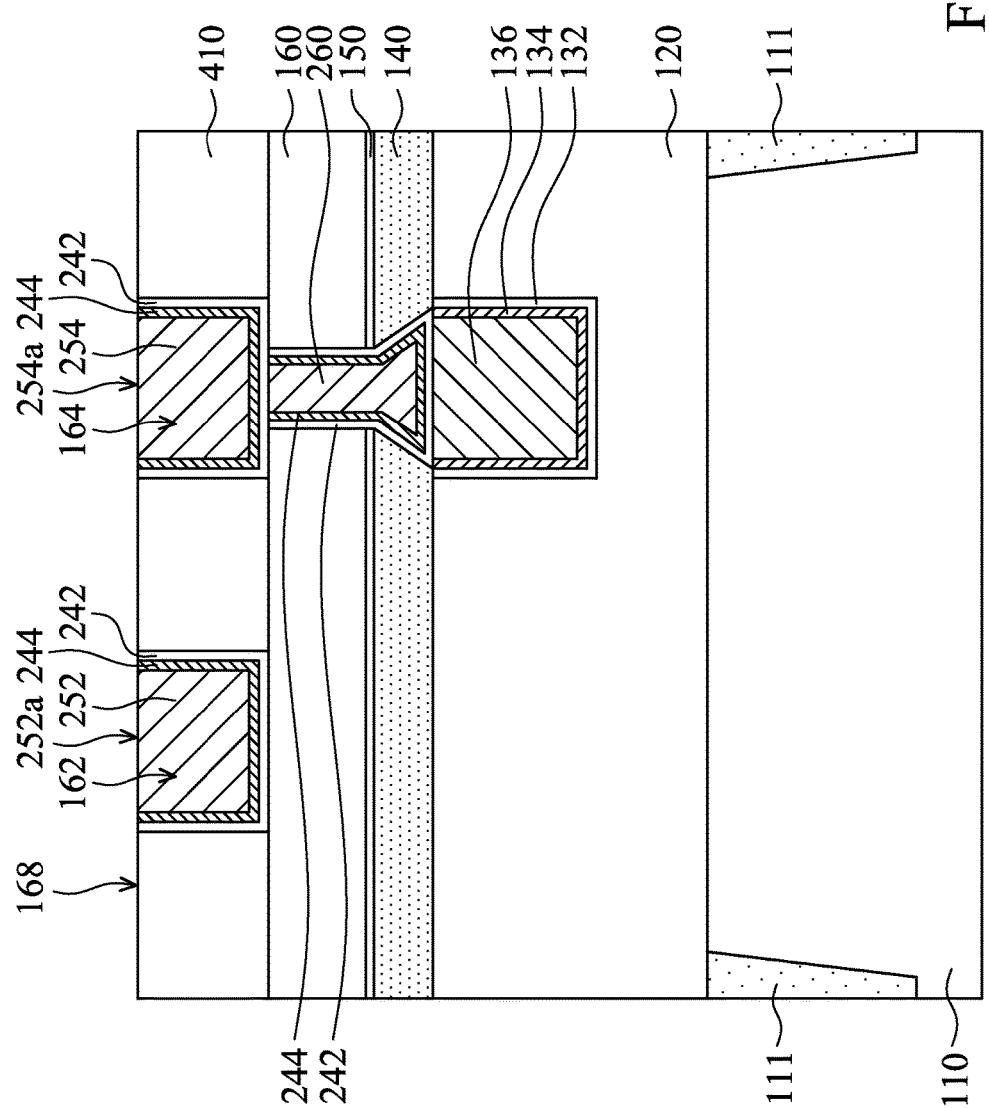
FIG. 4 is a cross-sectional view of a semiconductor device structure, in accordance with some embodiments.

As shown in FIG. 1H, the inner wall 142c is a planar inner wall, in accordance with some embodiments. In some other embodiments, the inner wall 142c is a curved inner wall (as shown in FIG. 3). As shown in FIG. 1H, the conductive lines 252 and 254 and the conductive via structure 260 are formed in the same dielectric layer 160, in accordance with some embodiments. In some other embodiments, the conductive lines 252 and 254 and the conductive via structure 260 are formed in different dielectric layers 410 and 160 (as shown in FIG. 4), in accordance with some embodiments. As shown in FIG. 4, the conductive via structure 260 passes through the dielectric layer 160, the adhesive layer 150, and the dielectric layer 140, in accordance with some embodiments.

In accordance with some embodiments, semiconductor device structures and methods for forming the same are provided. The methods (for forming the semiconductor device structure) form a conductive via structure with an enlarged end portion. Therefore, the probability of connecting the conductive via structure with the enlarged end portion to a conductive structure thereunder is increased. As a result, the yield is improved. Furthermore, the enlarged end portion is able to reduce the contact resistance between the conductive via structure and the conductive structure thereunder.

In accordance with some embodiments, a semiconductor device structure is provided. The semiconductor device structure includes a substrate and a first dielectric layer over the substrate. The semiconductor device structure includes a second dielectric layer over the first dielectric layer. The first dielectric layer and the second dielectric layer are made of different materials. The semiconductor device structure includes a conductive via structure passing through the first dielectric layer and penetrating into the second dielectric layer. The conductive via structure has a first portion and a second portion. The first portion and the second portion are in the first dielectric layer and the second dielectric layer respectively. The first portion has a first end portion facing the substrate. A first width of the first end portion is greater than a second width of the second portion.

In accordance with some embodiments, a semiconductor device structure is provided. The semiconductor device structure includes a substrate. The semiconductor device structure includes a first dielectric layer over the substrate. The semiconductor device structure includes a second dielectric layer over the first dielectric layer. The first dielectric layer and the second dielectric layer are made of different materials. The semiconductor device structure includes a conductive via structure passing through the first dielectric layer and penetrating into the second dielectric layer. The conductive via structure has a first portion and a second portion. The first portion and the second portion are in the first dielectric layer and the second dielectric layer respectively. A first width of the first portion continuously increases in a direction from the second dielectric layer to the substrate.

In accordance with some embodiments, a method for forming a semiconductor device structure is provided. The method includes forming a first dielectric layer over a substrate. The method includes forming a second dielectric layer over the first dielectric layer. The first dielectric layer and the second dielectric layer are made of different materials. The method includes forming a through hole in the first dielectric layer and a hole in the second dielectric layer. The through hole is connected to the hole. The through hole has a first end opening and a second end opening. The first end opening faces the substrate. The second end opening faces the hole. A first width of the first end opening is greater than a second width of the second end opening. The method includes forming a conductive via structure in the through hole and the hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate;
   a first dielectric layer over the substrate;
   a second dielectric layer over the first dielectric layer, wherein the first dielectric layer and the second dielectric layer are made of different materials; and
   a conductive via structure passing through the first dielectric layer and penetrating into the second dielectric layer,
   wherein the conductive via structure has a first portion and a second portion, the first portion and the second portion are in the first dielectric layer and the second dielectric layer respectively, the first portion has a first end portion facing the substrate, a first width of the first end portion is greater than a second width of the second portion, the first portion further has a second end portion adjacent to the second portion, and the first width of the first end portion is greater than a third width of the second end portion.

2. The semiconductor device structure as claimed in claim 1, further comprising:
   a conductive line in the second dielectric layer and over the conductive via structure.

3. The semiconductor device structure as claimed in claim 2, wherein the second portion of the conductive via structure is in direct contact with the conductive line.

4. The semiconductor device structure as claimed in claim 2, wherein the first width of the first end portion is less than a fourth width of the conductive line.

5. The semiconductor device structure as claimed in claim 1, further comprising:
   a third dielectric layer between the substrate and the first dielectric layer; and
   a conductive line in the third dielectric layer and under the conductive via structure, wherein the conductive line is electrically connected to the conductive via structure.

6. The semiconductor device structure as claimed in claim 5, wherein the first width of the first end portion is less than a fourth width of the conductive line.

7. The semiconductor device structure as claimed in claim 1, wherein the conductive via structure further passes through the second dielectric layer.

8. A semiconductor device structure, comprising:
   a substrate;
   a first dielectric layer over the substrate;
   a second dielectric layer over the first dielectric layer, wherein the first dielectric layer and the second dielectric layer are made of different materials;
   a conductive via structure passing through the first dielectric layer and penetrating into the second dielectric layer, wherein the conductive via structure has a first portion and a second portion, the first portion and the second portion are in the first dielectric layer and the second dielectric layer respectively, a first width of the first portion continuously increases in a direction from the second dielectric layer to the substrate, the first portion has a first end portion, and the first end portion faces the substrate; and
   a conductive line in the second dielectric layer and over the conductive via structure, wherein a second width of the first end portion is greater than a third width of the second portion, and the second width of the first end portion is less than a fourth width of the conductive line.

9. The semiconductor device structure as claimed in claim 8, wherein the first portion further has a second end portion, the second end portion is adjacent to the second portion, and the second width of the first end portion is greater than a fifth width of the second end portion.

10. The semiconductor device structure as claimed in claim 8, further comprising:
    an adhesive layer between the first dielectric layer and the second dielectric layer, wherein the conductive via structure further passes through the adhesive layer.

11. The semiconductor device structure as claimed in claim 10, wherein the adhesive layer, the first dielectric layer, and the second dielectric layer are made of different materials.

12. The semiconductor device structure as claimed in claim 8, wherein the first dielectric layer comprises silicon carbide or silicon nitride.

13. The semiconductor device structure as claimed in claim 8, further comprising:
    a third dielectric layer between the substrate and the first dielectric layer; and
    a conductive structure in the third dielectric layer and under the conductive via structure, wherein the conductive structure is electrically connected to the conductive via structure.

14. A method for forming a semiconductor device structure, comprising:
    forming a first dielectric layer over a substrate;
    forming a second dielectric layer over the first dielectric layer, wherein the first dielectric layer and the second dielectric layer are made of different materials;
    forming a through hole in the first dielectric layer and a hole in the second dielectric layer, wherein the through hole is connected to the hole, the through hole has a first end opening and a second end opening, the first end opening faces the substrate, the second end opening faces the hole, a first width of the first end opening is greater than a second width of the second end opening;

forming a conductive via structure in the through hole and the hole;

before the formation of the conductive via structure, forming a trench in the second dielectric layer, wherein the trench is connected to the hole; and during the formation of the conductive via structure, forming a conductive line in the trench.

15. The method for forming a semiconductor device structure as claimed in claim 14, wherein the formation of the through hole and the hole comprises:

forming a mask layer over the second dielectric layer, wherein the mask layer has an opening exposing a first portion of the second dielectric layer; and performing a dry etching process to remove the first portion of the second dielectric layer and a second portion of the first dielectric layer below the first portion.

16. The method for forming a semiconductor device structure as claimed in claim 15, wherein the dry etching process comprises a plasma etching process.

17. The method for forming a semiconductor device structure as claimed in claim 14, wherein the first width of the first end opening is less than a third width of the trench.

\* \* \* \* \*